United States Patent [19]

Yamakawa

[11] Patent Number: 4,746,958
[45] Date of Patent: May 24, 1988

[54] METHOD AND APPARATUS FOR PROJECTION PRINTING

[75] Inventor: Masahiro Yamakawa, Kawasaki, Japan

[73] Assignee: Fujitsu Limited, Kawasaki, Japan

[21] Appl. No.: 63,471

[22] Filed: Jun. 18, 1987

[30] Foreign Application Priority Data

Jun. 18, 1986 [JP] Japan .................. 61-142545

[51] Int. Cl.$^4$ ............ G03B 27/74; G03B 27/80; G03B 27/32
[52] U.S. Cl. .................. 355/68; 355/53; 355/77
[58] Field of Search .......... 355/43, 53, 68, 77, 355/20

[56] References Cited

U.S. PATENT DOCUMENTS

| | | | |
|---|---|---|---|
| 2,444,675 | 7/1948 | Rath | 355/68 |
| 2,857,555 | 10/1958 | Koen et al. | 355/68 X |
| 3,170,367 | 2/1965 | Wick | 355/68 X |
| 3,222,983 | 12/1965 | Ouchi | 355/68 |
| 3,422,442 | 1/1969 | Glendinning et al. | 355/68 X |
| 3,677,641 | 7/1972 | King et al. | 355/68 X |
| 3,874,793 | 4/1975 | Nielsen | 355/68 |
| 3,907,428 | 9/1975 | Norgaard et al. | 355/68 |
| 4,265,532 | 5/1981 | McIntosh | 355/20 |
| 4,512,657 | 4/1985 | Sakato | 355/68 |
| 4,540,277 | 9/1985 | Mayer et al. | 355/54 X |

*Primary Examiner*—Richard A. Wintercorn
*Attorney, Agent, or Firm*—Staas & Halsey

[57] ABSTRACT

Method and apparatus for projection printing uses a photodetector provided on a first plane which is approximately the same as a second plane on which an exposure takes place on a substrate when an image of a pattern is projected on the substrate, and moves the photodetector to arbitrary positions on the first plane so as to measure the illuminance at the arbitrary positions and obtain an illuminance distribution. An optical system is adjusted to obtain a uniform illuminance distribution before projecting the image of the pattern on the substrate.

11 Claims, 8 Drawing Sheets

FIG. 17A
|326|326|325|324|323|323|324|325|325|328|330|332|330|330|
|321|326|326|323|322|322|322|323|323|323|325|326|327|330|
|324|323|323|324|324|324|326|325|324|324|327|328|331|332|
|325|324|324|324|324|326|327|328|329|327|328|326|328|327|
|324|325|327|328|329|332|331|331|330|328|327|327|329|329|
|324|324|324|326|328|331|334|334|334|333|331|329|328|327|
|325|326|330|333|335|336|337|336|334|332|330|328|328|329|
|325|325|325|329|331|334|336|338|338|337|335|334|331|329|
|327|329|332|335|336|337|339|338|338|335|333|331|331|330|
|326|328|329|329|335|334|336|339|338|338|333|334|332|332|
|329|329|329|332|334|336|336|336|336|334|332|332|331|331|
|329|329|329|330|333|334|334|333|333|332|332|333|333|334|
|320|330|331|331|331|331|331|330|331|331|331|332|334|334|
|320|328|331|332|331|331|333|333|332|333|334|335|335|330|
FIG. 3A PRIOR ART
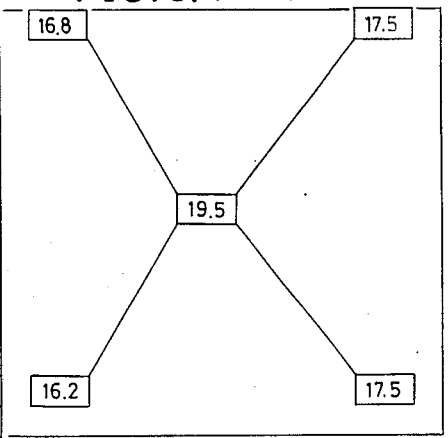
FIG. 17B
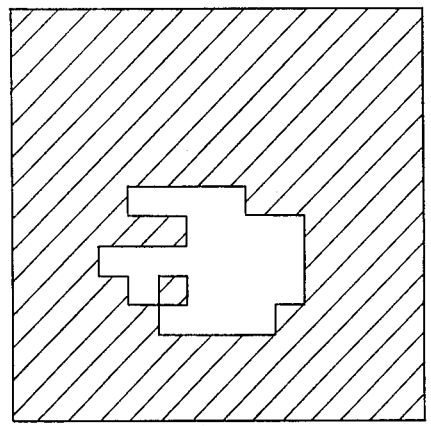
320~334 mw/cm²
FIG. 3B PRIOR ART
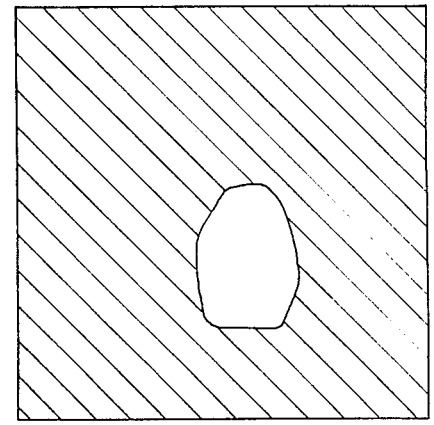
195 msec
FIG. 17C
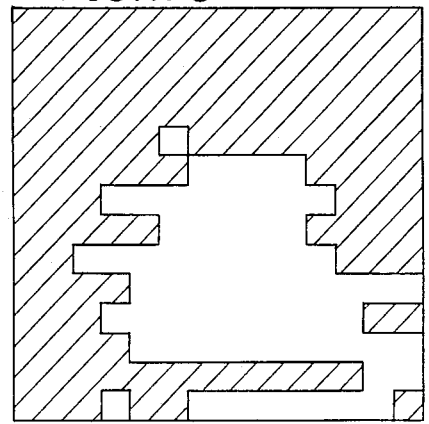
320~331 mw/cm²
FIG. 3C PRIOR ART
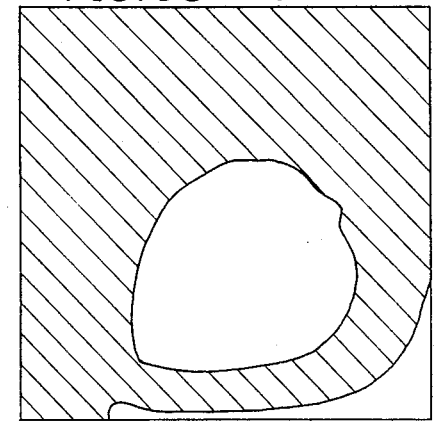
200 msec 320~328 mw/cm²

230 msec

320~325 mw/cm²

235 msec

320~322 mw/cm²

240 msec

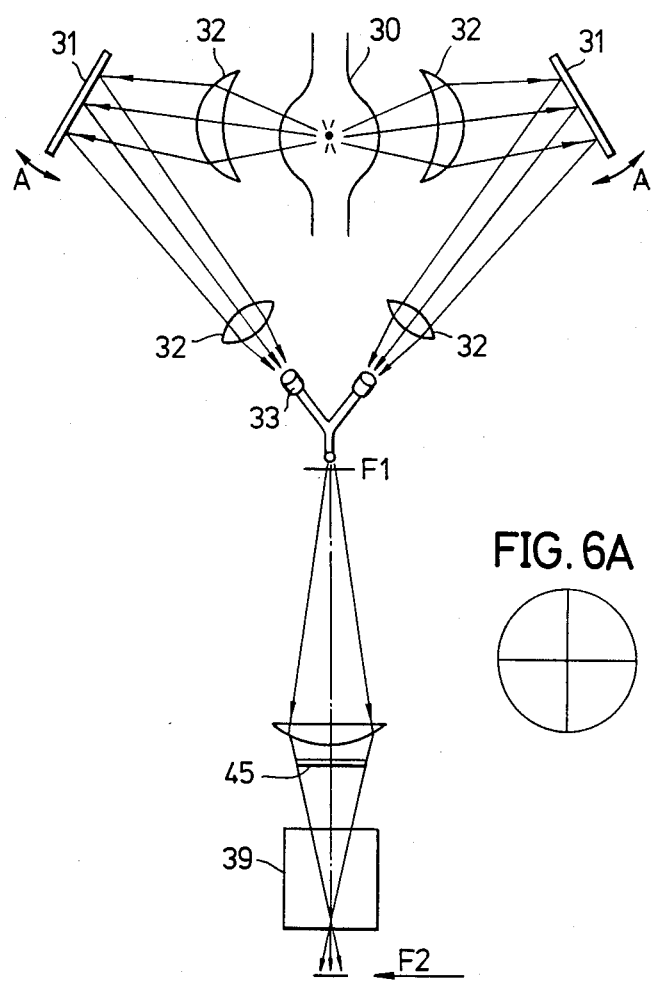
FIG. 5
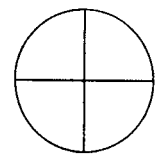
FIG. 6A
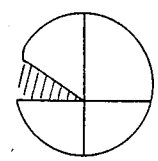
FIG. 7A
FIG. 6B  FIG. 7B 

METHOD AND APPARATUS FOR PROJECTION PRINTING

BACKGROUND OF THE INVENTION

The present invention generally relates to methods and apparatuses for projection printing, and more particularly to a method and apparatus for projection printing suited for application in a projection printing (exposure) on a wafer or a mask when producing a semiconductor device.

A reduction projection printer (stepper) generally comprises a mercury-vapor lamp, a reducing lens, an X-Y stage, and a chuck. A wafer is secured on the chuck which is fixed on the X-Y stage, and an integrated circuit (IC) pattern on a reticle is reduced via the reduction lens and an image thereof is formed on the wafer to carry out the exposure. In order to form a circuit pattern with a high accuracy by a developing process which is carried out after the exposure process, it is necessary that the illuminance has a predetermined value and is uniform within a predetermined exposure region on the wafer.

Accordingly, when an inconsistent exposure is detected in the circuit pattern after the exposure and developing processes or the mercury-vapor lamp is changed, an illuminance measuring apparatus is used to measure the illuminance and illuminance distribution. A conventional illuminance measuring apparatus comprises a substrate and five photodetectors arranged at predetermined locations on the substrate. The illuminance measuring apparatus is inserted into the reduction projection printer in place of the reticle when measuring the illuminance, and the illuminance and illuminance distribution at the IC pattern of the reticle are measured from outputs of the photodetectors.

However, the light emitted from the mercury-vapor lamp passes through the reticle and the reduction lens before being focused on a predetermined exposure region of the wafer. Accordingly, it is impossible to know accurately from the measured results obtained at the reticle position the illuminance and illuminance distribution in the predetermined exposure region. Hence, there is a problem from the point of view of controlling the illuminance in the actual exposure region on the wafer. In addition, the characteristics of the photodetectors are not perfectly identical among the independent photodetectors, and for this reason, the reliability of the measured results obtained from the conventional illuminance measuring apparatus is unsatisfactory.

Accordingly, in addition to the measurement made in the illuminance measuring apparatus, an open frame test is conventionally carried out to detect the illuminance distribution on the actual wafer surface. The open frame test is carried out by exposing a dummy wafer which has a photoresist layer formed thereon, and changing the exposure time so as to detect the illuminance distribution on the water surface. However, according to such a method of measuring the illuminance, it is necessary to carry out the open frame test for detecting the illuminance distribution on the wafer surface in addition to measuring the illuminance at the reticle position. As a result, there are problems in that the processes of obtaining the illuminance and illuminance distribution in the predetermined exposure region are complex and troublesome to carry out.

Furthermore, when inserting the illuminance measuring apparatus (substrate having the photodetectors) into the stepper in place of the reticle, a platten (base) on which the reticle is placed may become scratched and damaged. There is also a problem in that dust particles and the like easily enter into the stepper at the insertion and extraction of the reticle and the illuminance measuring apparatus. Moreover, the operation sequence of removing the reticle from the stepper, inserting and then removing the illuminance measuring apparatus from the stepper, and again inserting the reticle into the stepper is extremely troublesome to carry out and is also time consuming. Normally, the serviceable life of the mercury-vapor lamp is 400 hours to 500 hours, and there is a problem in that the exposure efficiency of the stepper is poor because the operation sequence must be carried out every time the mercury-vapor lamp is changed.

It is possible to conceive a method of measuring the illuminance by providing a photodetector device at the position of the chuck so that the illuminance and illuminance distribution on the actual wafer surface can be measured. However, a distance between the reduction lens and the chuck is extremely small, and a generally available photodetector device is too bulky to fit between the reduction lens and the chuck. It is also possible to conceive a method of measuring the illuminance by providing a plurality of photodetectors at the position of the wafer, but as described before, the characteristics of the photodetectors are not perfectly identical among the independent photodetectors, and there is a problem in that it is impossible to obtain from the measured results the illuminance and illuminance distribution which are highly reliable. Furthermore, even the smallest photodetector available has such a light receiving surface with a square area of 2.5 mm to 4 mm per side that is not small compared to the exposure region which has a square area of 10 mm to 14 mm per side, and it is impossible to measure the illuminance within a small region.

SUMMARY OF THE INVENTION

Accordingly, it is a general object of the present invention to provide a novel and useful method and apparatus for projection printing, in which the problems described heretofore are eliminated.

Another and more specific object of the present invention is to provide a method of projection printing for partially exposing a substrate by projecting an image of a pattern on the substrate by use of an optical system to irradiate a light from a light source onto the substrate via a mask which has the pattern formed thereof. The method comprises the steps of irradiating the light obtained via the optical system on photodetector means arranged on a first plane which is approximately the same as a second plane on which the exposure takes place on the substrate so as to measure an illuminance within a predetermined portion of an exposure region on the first plane, successively moving the photodetector means on the first plane to a plurality of arbitrary positions within the exposure region so as to measure illuminances within a plurality of predetermined portions of the exposure region and to obtain an illuminance distribution within the exposure region, adjusting the optical system when the obtained illuminance distribution is non-uniform so as to obtain a uniform illuminance distribution, and placing the mask between the light source and the substrate so as to project the image of the pattern and partially expose the substrate by use of the light having the uniform illuminance distribution within the exposure region. According to the method of the present invention, it is possible to accurately measure the illuminance and illuminance distribution on the image formation plane before the image of the pattern is projected on the substrate. Conventionally, it was difficult to accurately measure the illuminance at the image formation plane, and the illuminance was measured at the reticle position for this reason. Hence, it is necessary to carry out the troublesome operation sequence of removing the reticle from the exposure apparatus, inserting and then removing the illuminance measuring apparatus from the exposure apparatus, and again inserting the reticle into the projection printer. However, such a troublesome operation sequence is unnecessary according to the present invention. In addition, it is possible to accurately measure the illuminance and illuminance distribution in a predetermined exposure region on the substrate and not at the reticle position. Furthermore, there is no need to carry out an open frame test.

Still another object of the present invention is to provide a projection printer comprising a light source for generating a light, a first part where a substrate is placed for exposure, a second part where a mask is placed when projecting an image of a pattern formed on the mask onto the substrate, where the second part is located between the light source and the first part, an optical system located between the light source and the first part, photodetector means arranged on a first plane which is approximately the same as a second plane on which the exposure takes place on the substrate when projecting the image of the pattern, where the light from the light source is irradiated within an exposure region on the first plane and over the photodetector means via the optical system when measuring an illuminance and is irradiated within an exposure region on the substrate via the mask and the optical system when projecting the image of the pattern, moving means for moving the photodetector means on the first plane to one or a plurality of arbitrary positions within the exposure region on the first plane when measuring the illuminance within one or a plurality of predetermined portions of the exposure region, and measuring means for measuring the illuminance within the one or plurality of predetermined portions from an output of the photodetector means at the one or plurality of arbitrary positions. According to the projection printer of the present invention, it is possible to accurately measure the illuminance and illuminance distribution on the image formation plane before the image of the pattern is projected on the substrate. Although the construction of the projection printer is simple, it is possible to accurately measure the illuminance and illuminance distribution in a predetermined exposure region on the substrate by a simple operation, by fixing the photodetector means on an X-Y stage which is mounted with a chuck for securing the substrate and moving the X-Y stage by the moving means.

A further object of the present invention is to provide a projection printer in which the photodetector means is constituted by a photodetector element, a covering member for covering the photodetector element and a pinhole formed in the covering member at a position confronting the photodetector element. According to the projection printer of the present invention, it is possible to measure the illuminance within an extremely small region on the image formation plane.

Another object of the present invention is to provide a projection printer in which top and bottom surfaces of the covering member have low reflection coefficients. According to the projection printer of the present invention, an error is unlikely to occur in the measured illuminance because the reflection at the top and bottom surfaces of the covering member is suppressed, and it is possible to measure the illuminance and illuminance distribution with a further improved accuracy.

Other objects and further objects of the present invention will be apparent from the following detailed description when read in conjunction with the accompanying drawings.

BRIEF DESCRIPTION OF THE DRAWINGS

FIG. 3A shows a measured result at a reticle position and FIGS. 3B through 3F are diagrams for explaining results obtained in an open frame test which is carried out in the conventional method of projection printing;

FIG. 5 is a view in cross section showing an essential part of an optical system of the reduction projection printer shown in FIG. 4;

FIGS. 6A, 6B, 7A and 7B are diagrams for explaining a method of adjusting the optical system;

FIGS. 17A through 17F are diagrams for explaining the measured results obtained by the method and apparatus for projection printing according to the present invention.

DETAILED DESCRIPTION

Figure 1:
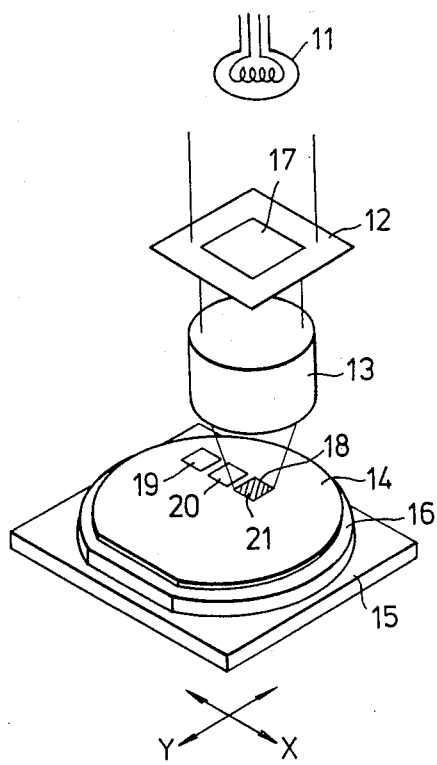
FIG. 1 is a perspective view showing a reduction projection printer which is used in a semiconductor device producing apparatus for explaining the conventional method and apparatus for projection printing.

FIG. 1 shows only an essential part of the reduction projection printer (stepper) which is used in the semiconductor device producing apparatus. In FIG. 1, the stepper comprises a mercury-vapor lamp 11, a reticle 12, a reduction lens 13, and a wafer 14 coated with a photoresist. The wafer 14 is secured on a chuck 16 which is fixed on an X-Y stage 15. An IC pattern 17 of the reticle 12 is reduced by being passed through the reduction lens 13 and an image thereof is formed on the wafer 14 to carry out the exposure.

The exposure is carried out intermittently in a repeated manner by moving the X-Y stage 15. In FIG. 1, a pattern 18 is in exposure, and patterns 19 and 20 are already exposed.

In order to form a circuit pattern with a high accuracy by a developing process which is carried out after the exposure process, it is necessary that the illuminance has a predetermined value and is uniform within a rectangular exposure region 21 indicated by hatchings on the wafer 14.

Figure 2:
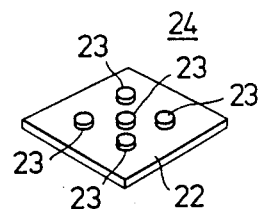
FIG. 2 is a perspective view showing an essential part of an illuminance measuring apparatus employed in the conventional method of projection printing.

Accordingly, when an inconsistent exposure is detected in the circuit pattern after the exposure and developing processes or the mercury-vapor lamp 11 is changed, an illuminance measuring apparatus is used to measure the illuminance and illuminance distribution. A conventional illuminance measuring apparatus 24 comprises a substrate 22 and five photodetectors 23 arranged at predetermined locations on the substrate 22 as shown in FIG. 2. The illuminance measuring apparatus 24 is inserted into the reduction projection printer in place of the reticle 12 when measuring the illuminance, and the illuminance and illuminance distribution at the IC pattern 17 of the reticle 12 are measured from outputs of the photodetectors 23.

However, the light emitted from the mercury-vapor lamp 11 passes through the reticle 12 and the reduction lens 13 before being focused on the exposure region 21 on the wafer 14. Accordingly, it is impossible to know accurately from the measured results obtained at the reticle position the illuminance and illuminance distribution in the exposure region 21. Hence, there is a problem from the point of view of controlling the illuminance in the actual exposure region 21 on the wafer 14. In addition, the characteristics of the photodetectors 23 are not perfectly identical among the independent photodetectors 23, and for this reason, the reliability of the measured results obtained from the conventional illuminance measuring apparatus 24 is unsatisfactory.

Figure 3D:
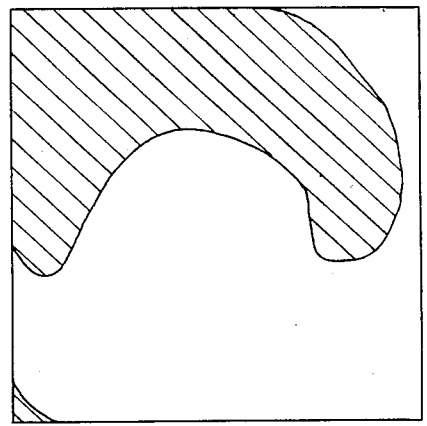
Figure 17E:
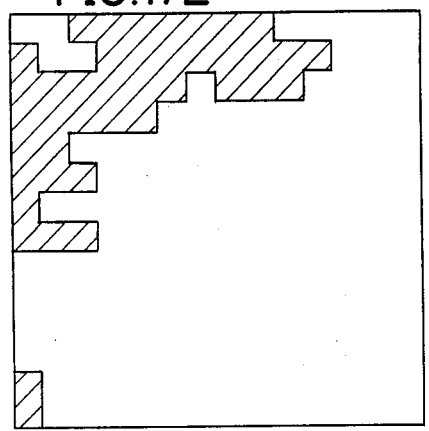
Figure 3E:
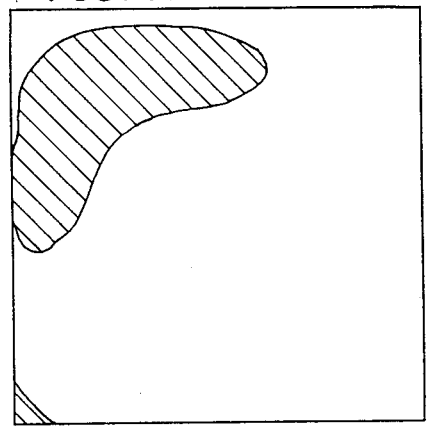
Figure 17F:
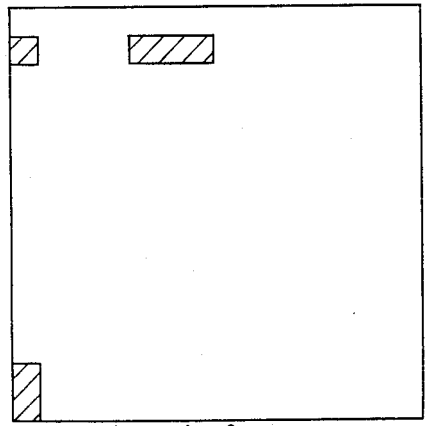
Figure 3F:
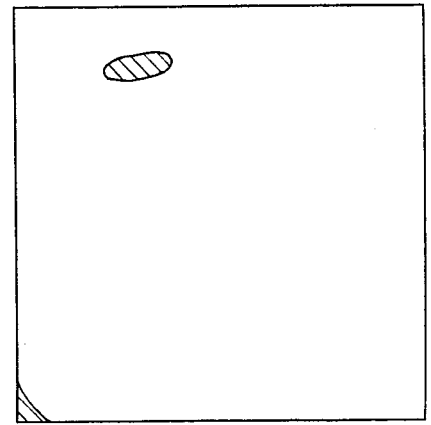

Accordingly, in addition to the measurement made in the illuminance measuring apparatus 24, an open frame test is conventionally carried out to detect the illuminance distribution on the actual wafer surface. The open frame test is carried out by exposing a dummy wafer which has a photoresist layer formed thereon, and changing the exposure time so as to detect the illuminance distribution on the wafer surface. FIG. 3A shows an example of the illuminance in $mW/cm^2$ measured by the illuminance measuring apparatus 24 at the five positions of the photodetectors 23. FIGS. 3B through 3F respectively show exposure states obtained by the open frame test for exposure times of 195 msec, 200 msec, 230 msec, 235 msec and 240 msec, where portions where the photoresist remain are indicated by hatchings.

However, according to such a method of measuring the illuminance, it is necessary to carry out the open frame test for detecting the illuminance distribution on the wafer surface in addition to measuring the illuminance at the reticle position. As a result, there are problems in that the processes of obtaining the illuminance and illuminance distribution in the exposure region 21 are complex and troublesome to carry out.

Figure 4:
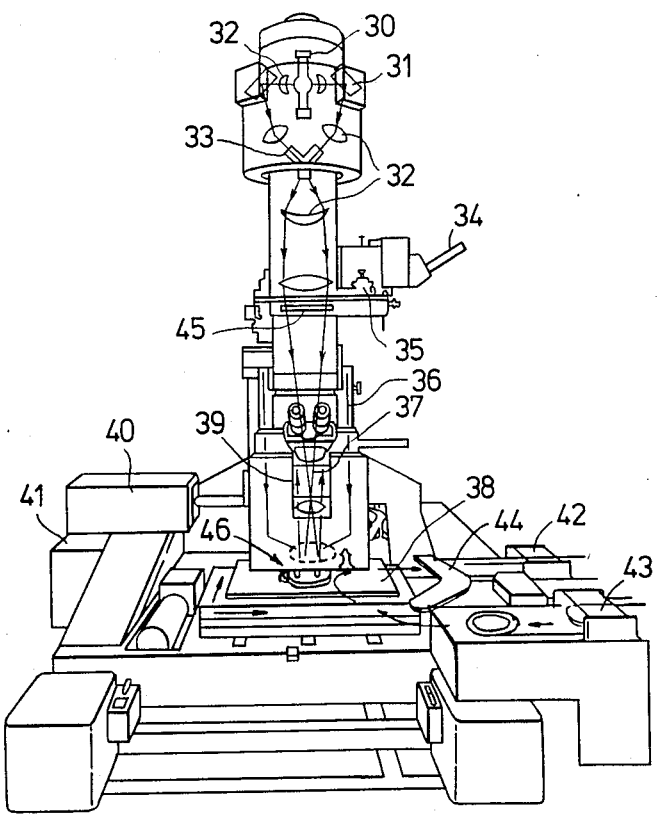
FIG. 4 is a perspective view showing the whole reduction projection printer which is used in the semiconductor device producing apparatus for explaining the method and apparatus for projection printing according to the present invention.

FIG. 4 generally shows the whole reduction projection printer (stepper) which is used in the semiconductor device producing apparatus which may be applied with the method and apparatus for projection printing according to the present invention. The stepper generally comprises a mercury-vapor lamp 30, four mirrors 31, a total of eight condenser lenses 32, fibers 33, a reticle alignment part 34, a bilateral masking aperture 35, an automatic focusing mechanism 36, a wafer alignment part 37, an X-Y stage 38, a reduction lens 39, a closed-circuit television (CCTV) camera 40 for alignment motor, a laser transducer 41, a wafer receiver 42, a wafer sender 43, and a wafer transferring part 44. A reticle 45 is inserted and secured at a position shown in FIG. 4, and an illuminance measuring apparatus 46 is fixed on the X-Y stage 38.

FIG. 5 shows an essential part of an optical system of the stepper shown in FIG. 4. In FIG. 5, those parts which are the same as those corresponding parts in FIG. 4 are designated by the same reference numerals, and description thereof will be omitted. When a normal fiber image shown in FIG. 6A is obtained at a position F1, a normal exposure shown in FIG. 6B is obtained at a position (image formation plane) F2. However, when an abnormal fiber image shown in FIG. 7A is obtained at the position F1, an abnormal exposure shown in FIG. 7B is obtained at the position F2. When the fiber image is abnormal, the inclination of the mirrors 31 are changed as indicated by arrows A in FIG. 5 so as to adjust the fiber image and obtain the normal exposure at the position F2.

Figure 8:
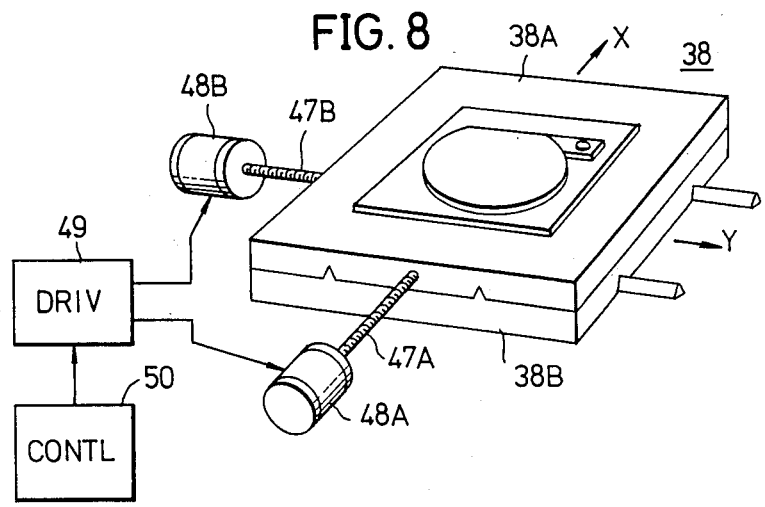
FIG. 8 is a perspective view showing an X-Y stage of the reduction projection printer shown in FIG. 4.

FIG. 8 shows the X-Y stage 38 of the stepper shown in FIG. 4 together with a driving part thereof. The X-Y stage 38 comprises an X-stage 38A which is slidable in a direction X on a pair of guide rails, and a Y-stage 38B which is slidable in a direction Y on a pair of guide rails. The X-stage 38A is coupled to a feed screw 47A, and the X-stage 38A is fed in the direction X when the feed screw 47A is rotated by a motor 48A. Similarly, the Y-stage 38B is coupled to a feed screw 47B, and the Y-stage 38B is fed in the direction Y when the feed screw 47B is rotated by a motor 48B. The motors 48A and 48B are driven responsive to output signals of a motor driving circuit 49 so that the X-Y stage 38 is moved to a desired position. A control part 50 is constituted by a central processing unit (CPU), for example, and controls the motor driving circuit 49 by supplying thereto a position information related to the desired position where the X-Y stage 38 is to reach. It is possible to program the control part 50 beforehand to store position information related to a plurality of positions and control the motor driving circuit 49 so that the X-Y stage 38 is sequentially moved to the plurality of positions automatically.

Figure 9:
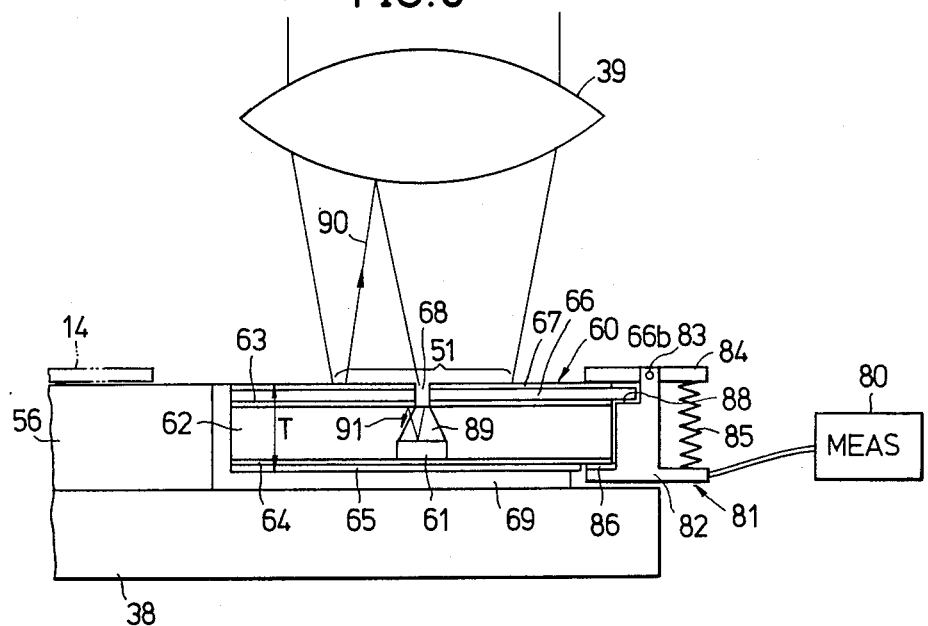
FIG. 9 is a view in cross section showing an illuminance measuring apparatus set on a first embodiment of the projection printer according to the present invention.
Figure 10:
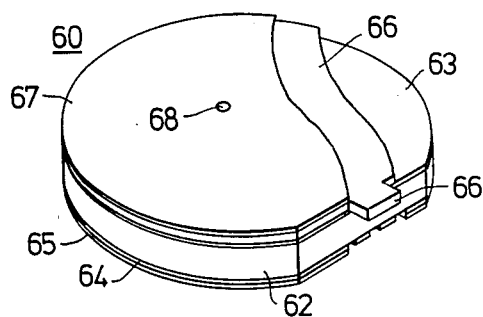
FIG. 10 is a perspective view with a part cut away showing the illuminance measuring apparatus used in the first embodiment.
Figure 11:
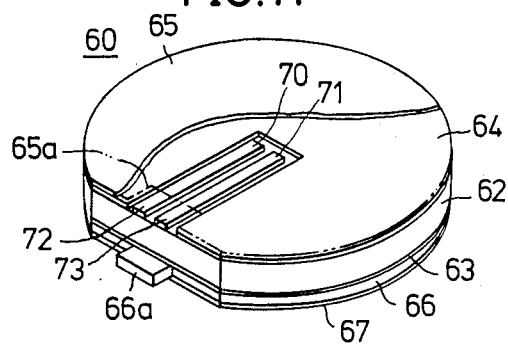
FIG. 11 is a perspective view with a part cut away showing the illuminance measuring apparatus used in the first embodiment in an upside down state.
Figure 12:
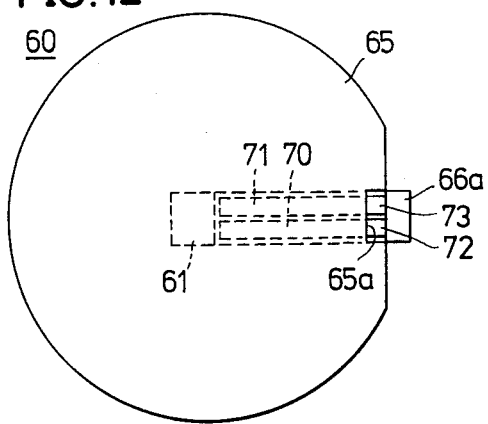
FIG. 12 is a bottom view of the illuminance measuring apparatus used in the first embodiment.

FIG. 9 shows an illuminance measuring apparatus used in a first embodiment of the projection printer according to the present invention, at a part where the illuminance measuring apparatus is set to the projection printer. FIG. 10 shows a perspective view of the illuminance measuring apparatus with a part cut away, FIG. 11 is a perspective view of the illuminance measuring apparatus with a part cut away in an upside down state, and FIG. 12 is a bottom view of the illuminance measuring apparatus.

In FIGS. 9 through 12, a photodetector 61 is fixed within a depression formed at the bottom of an approximately circular glass plate 62. The glass plate 62 has a diameter of approximately 20 mm.

A low reflection layer 63 is formed on a top surface of the glass plate 62, and a chromium layer 64 and an insulating layer 65 are formed on a bottom surface of the glass plate 62. An aluminum plate 66 is adhered on a top surface of the low reflection layer 63, and a low reflection layer 67 is provided on a top surface of the aluminum plate 66. A pinhole 68 is formed in the low reflection layers 67 and 63 and the aluminum plate 66, at a position confronting a center of the photodetector 61. The size of the pinhole 68 is considerably small compared to an area of an exposure region 51.

For example, when it is assumed that the area of an IC pattern 57 on the reticle 45 is ten to five times the area of the actual IC pattern, the area of the exposure region 51 is a square area of 10 mm to 14 mm per side. Accordingly, an area corresponding to the pinhole 68 is less than 1 mm$^2$, for example, and the diameter of the pinhole 38 is 1 mm in the present embodiment.

Figure 13:
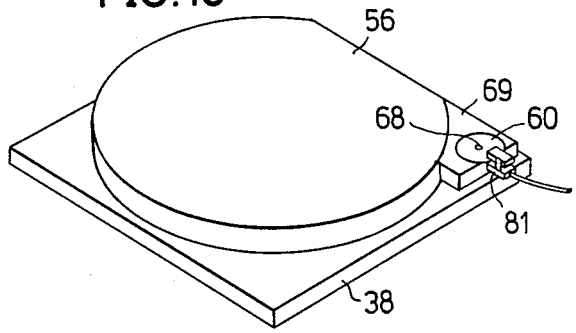
FIG. 13 is a perspective view showing the illuminance measuring apparatus used in the first embodiment mounted on the X-Y stage.

The thicknesses of the glass plate 62 and the aluminum plate 66 are set as thin as possible, and the layers 63, 64, 65 and 67 are formed by a vapor deposition process, for example, so that a thickness T of the illuminance measuring apparatus 60 is small and is approximately 7 mm. The illuminance measuring apparatus 60 having this thin configuration is fixed on a base 69 as shown in FIGS. 9 and 13 so that the top surface of the illuminance measuring apparatus 60 approximately coincides with a top surface of a chuck 56. The illuminance measuring apparatus 60 is located on the X-Y stage 38 at a position adjacent to the chuck 56.

In the present embodiment, the low reflection layers 63 and 67 are made of a metal oxide having a low reflection coefficient, and the insulating layer 65 is an oxide layer.

The chromium layer 64 has a function of radiating heat generated by the photodetector 61. However, in the present embodiment, the chromium layer 64 is also used to form lead wires 70 and 71 for the photodetector 61 and terminals 72 and 73, as shown in FIGS. 11 and 12. In other words, the chromium layer 64 is etched so that the parallel lead wires 70 and 71 remain between the peripheral and central portion of the glass plate 62. A cutout 65a is formed in the insulating layer 65 so as to expose the terminals 72 and 73 at a position corresponding to a position of a projection 66a of the aluminum plate 66.

When measuring the illuminance, a measuring device 80 is coupled to the illuminance measuring apparatus 60 by a connector 81. The reticle 45 is not set in the stepper.

Figure 14:
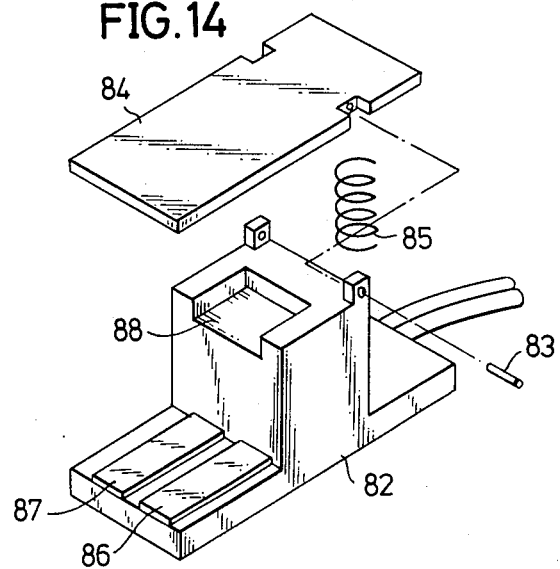
FIG. 14 is a disassembled perspective view showing a connector which is coupled to the illuminance measuring apparatus used in the first embodiment.

As shown in FIG. 14, the connector 81 comprises a main body 82, a pinching plate 84 supported on the main body 82 about a pin 83, and a coil spring 85. Contact portions 86 and 87 and a guide groove 88 are formed on the main body 82. The connector 81 is connected to the illuminance measuring apparatus 60 by a pinching action of the coil spring 85 and the pinching plate 84.

As shown in FIGS. 9 and 13, the connector 81 is connected to the illuminance measuring apparatus 60 by pinching an end thereof, in a state where the guide groove 88 engages the projection 66a and the contact portions 86 and 87 contact the corresponding terminals 72 and 73.

Figure 15:
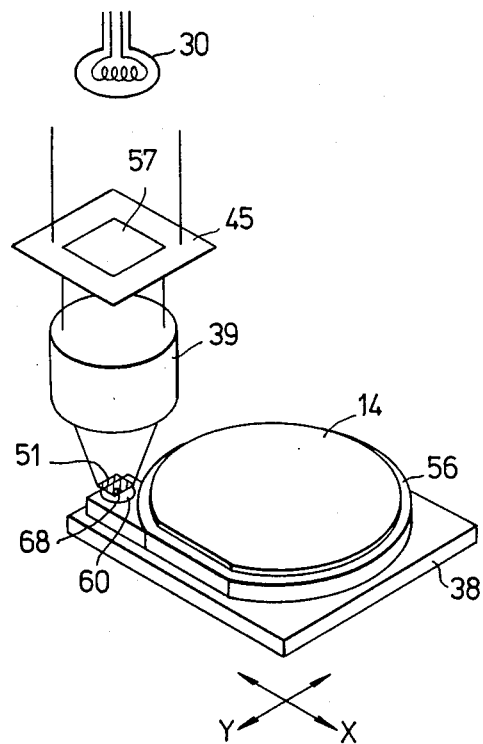
FIG. 15 is a perspective view showing the illuminance measuring apparatus used in the first embodiment in an operating state.
Figure 16:
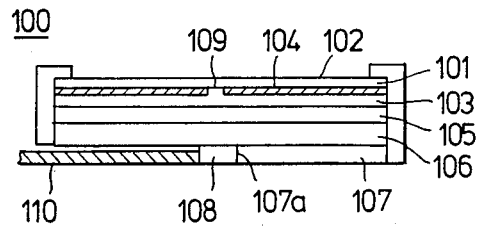
FIG. 16 is a view in cross section showing an illuminance measuring apparatus used in a second embodiment of the projection printer according to the present invention.

The X-Y stage 38 is moved in the directions X and Y in FIG. 15, and the illuminance is measured by positioning the pinhole 68 to a plurality of predetermined positions (for example, four corner positions and a center position) within the exposure region 51. FIG. 15 shows the state where the illuminance is measured with the pinhole 68 positioned at one of the corner positions within the exposure region 51. Out of the light passing through the reduction lens 39 and reaching the exposure region 51, the light corresponding to the pinhole 68 passes through the pinhole 68 and is diffracted as indicated by a reference numeral 89 to be irradiated on the entire light receiving surface of the photodetector 61. The photodetector 61 outputs a signal dependent on the illuminance of the received light, and the output signal of the photodetector 61 is supplied to the measuring device 80 via the connector 81. The measuring device 80 thus measures the illuminance at the one corner position within the exposure region 51. The pinhole 68 is moved as described before so as to measure the illuminance at the plurality of positions within the exposure region 51 and obtain the illuminance distribution within the exposure region 51.

The illuminance distribution is measured periodically, such as when the mercury-vapor lamp 30 is changed, and when the illuminance distribution is not uniform the optical system is adjusted so that a uniform illuminance distribution is obtained within the exposure region 51. The wafer 14 which is used as a substrate on which the exposure is to take place may either be set in the stepper before or after the illuminance distribution is measured.

After the illuminance distribution is measured and the optical system is adjusted according to the needs, the reticle 45 is set in the stepper and the photoresist on the top surface of the wafer 14 is exposed. Since the exposure takes place with a uniform illuminance distribution, it is possible to form a circuit pattern with a high accuracy by a developing process which is carried out after the exposure process. Identical patterns may be formed on a single wafer by use of one reticle, by repeatedly moving the X-Y stage 38 and carrying out the exposure.

The illuminance distribution is also measured when the patterns formed on the wafer by the exposure, developing and etching processes have dimensional errors greatly differing in the chip region.

Because the connector 81 is of the pinch type and not the plug-in type, it is possible to connect and disconnect the connector 81 on and from the illuminance measuring apparatus 60 without applying an external force thereon, and it is especially convenient since no external force should be applied to the X-Y stage 38. The engagement between the guide groove 88 and the projection 66a prevents the connector 81 from being disconnected during use.

Next, a description will be given on the construction of the illuminance measuring apparatus 60 itself for helping improve the measuring accuracy, by referring to FIG. 9. The low reflection layer 67 at the top surface of the illuminance measuring apparatus 60 suppresses the reflection of light at the top surface of the illuminance measuring apparatus 60.

If the low reflection layer 67 were not provided, the light reflected at the top surface of the illuminance measuring apparatus 60 would reflect at the lower surface of the reduction lens 39 as indicated by a reference numeral 90, and a portion of the reflected light would enter through the pinhole 68 and cause an error in the measurement of the illuminance. However, in the present embodiment, the reflection at the top surface of the illuminance measuring apparatus 60 is effectively suppressed, thereby causing virtually no error in the measurement of the illuminance.

Furthermore, the low reflection layer 63 is formed on a surface confronting the top surface of the photodetector 61, so as to similarly suppress a reflection above the photodetector 61.

If the low reflection layer 63 were not provided, the light reflected at the photodetector 61 would reflect at the surface confronting the light receiving surface of the photodetector 61 as indicated by a reference numeral 91, and a portion of the reflected light would again reach the photodetector 61 and cause an error in the measurement of the illuminance. However, in the present embodiment, the reflection at the surface confronting the light receiving surface of the photodetector 61 is effectively suppressed and the light that reaches the photodetector 61 the second time is extremely limited, thereby causing virtually no error in the measurement of the illuminance.

Hence, according to the projection printer provided with the illuminance measuring apparatus 60, it is possible to measure the illuminance within an extremely small portion of the exposure region 51 with a high accuracy.

The diameter of the illuminance measuring apparatus 60 is set to 20 mm in the present embodiment so that a light from a light emitting diode (LED, not shown) for checking the focus is reflected at the top surface of the illuminance measuring apparatus 60 even when measuring the illuminance at a corner portion within the exposure region 51. The stepper is unusually designed so that a shutter thereof does not open unless in focus, and the diameter of the illuminance measuring apparatus 60 is set as described above so that a focus checking device of the stepper always operates normally.

Next, a description will be given on a second embodiment of the projection printer according to the present invention. An illuminance measuring apparatus 100 of the present embodiment comprises a quartz plate 101 having a low reflection layer 102 formed on a top surface thereof by a vapor deposition process, for example, and having a sandy bottom surface, quartz plate 103 having a chromium layer 104 formed on a top surface thereof by a vapor deposition and having a sandy bottom surface, a color glass plate 105 having a filtering characteristic for blocking infrared rays, a color glass plate 106 having a filtering characteristic for passing a ray having a wavelength of 436 nm, a base 107, and a photodetector 108 embedded within a depression 107a of the base 107. A pinhole 109 is formed in the chromium layer 104 and has a diameter of 1 mm or less. For example, the photodetector 108 is constituted by a silicon photodiode, and an output cable 110 of the photodetector 108 is coupled to a measuring device which is not shown. The silicon photodiode has a square light receiving surface of 2.5 mm per side, for example.

For example, the quartz plates 101 and 103 respectively have a thickness of 0.4 mm, the color glass plate 105 has a thickness of 1.0 mm, the color glass 106 has a thickness of 2.2 mm, the base 107 has a thickness of 1.4 mm, and the thickness of the illuminance measuring apparatus 100 as a whole is approximately 6 mm.

In the present embodiment, the formation of the low reflection layers having the low reflection coefficients is easier compared to that of the first embodiment. The low reflection layer 102 reduces the light which reflects at the quartz plate 101 and reaches the reduction lens. In addition, the reflection of light at the bottom surfaces of the quartz plates 101 and 103 is satisfactorily reduced because the bottom surfaces are sandy. Accordingly, the measuring accuracy of the illuminance measuring apparatus 100 is further improved.

Figure 17D:
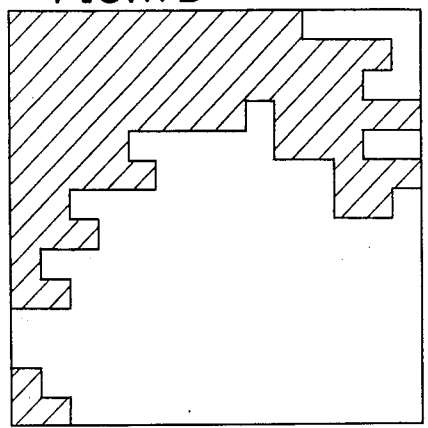

FIG. 17A shows the illuminance distribution which is measured by use of the illuminance measuring apparatus provided in the projection printer according to the present invention under the same conditions described before in conjunction with FIGS. 3A through 3F. The reticle that is used has an IC pattern five times that of the actual IC pattern, and the exposure region is a square region of 14 mm×14 mm. In FIG. 17A, the illuminance distribution is obtained in units of 1 mm. FIGS. 17B through 17F respectively show in hatchings portions where the measured illuminance is 320 to 334 mW/cm$^2$, 320 to 331 mW/cm$^2$, 320 to 328 mW/cm$^2$, 320 to 325 mW/cm$^2$, and 320 to 322 mW/cm$^2$. As may be seen by comparing FIGS. 17B through 17F with FIGS. 3B through 3F, it is possible to obtain an extremely accurate illuminance distribution from the measured results shown in FIG. 17A, without carrying out the conventional open frame test.

In the first and second embodiments described heretofore, the projection printer uses a single photodetector to detect the light from the reduction lens, but it is of course possible to measure the illuminance at the image formation plane of light by use of a plurality of photodetectors. However, as described before, the characteristics of the photodetectors are inconsistent among the individual photodetectors. Hence, when the inconsistent characteristics of the photodetectors are considered, a single photodetector is used in a most desirable embodiment of the present invention.

In addition, when a member having a low reflection characteristic is used in place of the aluminum plate 66, it is of course unnecessary to additionally form a low reflection layer.

In the embodiments described heretofore, the present invention is applied to the reduction projection printer of the semiconductor device producing apparatus. However, the present invention is also applicable to a projection printer which does not have the reducing function. In other words, the present invention is perfectly applicable to the case where the ratio between the size of the IC pattern of a mask such as the reticle and the size of the actual IC pattern is 1:1. In addition, it is also possible to apply the present invention to a projection printer which uses a reticle to produce a mask. In this case, the mask is used as the substrate on which is to take place instead of the wafer.

As described heretofore, according to the method and apparatus for projection printing according to the present invention, it is possible to measure the illuminance within an extremely small region. When the present invention is applied to the projection printer of the semiconductor device producing apparatus, it is possible to measure the illuminance within the exposure region on the wafer or mask, and the illuminance on the wafer of mask can be controlled with a high accuracy. Hence, the quality of the semiconductor device which is produced can be effectively improved.

Further, the present invention is not limited to these embodiments, but various variations and modifications may be made without departing from the scope of the present invention.

What is claimed is:

1. A method of projection printing for partially exposing a substrate by projecting an image of a pattern on said substrate by use of an optical system to irradiate a light from a light source onto said substrate via a mask which has said pattern formed thereof, said method comprising the steps of:
   (a) irradiating the light obtained via said optical system on photodetector means arranged on a first plane which is approximately the same as a second plane on which the exposure takes place on said substrate so as to measure an illuminance within a predetermined portion of an exposure region on said first plane;
   (b) successively moving said photodetector means on said first plane to a plurality of arbitrary positions within said exposure region so as to measure illuminances within a plurality of predetermined portions of said exposure region and to obtain an illuminance distribution within said exposure region;
   (c) adjusting said optical system when the obtained illuminance distribution is non-uniform so as to obtain a uniform illuminance distribution; and
   (d) placing said mask between said light source and said substrate so as to project the image of said pattern and partially expose said substrate by use of the light having the uniform illuminance distribution within said exposure region.

2. A method of projection printing as claimed in claim 1 in which said steps (a) and (b) are carried out with said photodetector means arranged on a stage on which said substrate is placed.

3. A method of projection printing as claimed in claim 2 in which said step (b) is carried out by successively moving said stage so that said photodetector is moved to said plurality of arbitrary positions within said exposure region.

4. A method of projection printing as claimed in claim 1 in which said steps (a) and (b) are carried out by use of said photodetector means comprising a single photodetector, a covering member which covers the single photodetector and a pinhole formed in the covering member at a position corresponding to that of the single photodetector, said step (a) being carried out with said photodetector means located at such a position that a position of the pinhole is within said predetermined portion of said exposure region.

5. A projection printer comprising:
   a light source for generating a light;
   a first part where a substrate is placed for exposure;
   a second part where a mask is placed when projecting an image of a pattern formed on said mask onto said substrate, said second part being located between said light source and said first part;
   an optical system located between said light source and said first part;
   photodetector means arranged on a first plane which is approximately the same as a second plane on which the exposure takes place on said substrate when projecting the image of said pattern, said light from said light source being irradiated within an exposure region on said first plane and over said photodetector means via said optical system when measuring an illuminance and being irradiated within an exposure reigon on said substrate via said mask and said optical system when projecting the image of said pattern;
   moving means for moving said photodetector means on said first plane to one or a plurality of arbitrary positions within the exposure region on said first plane when measuring the illuminance within one or a plurality of predetermined portions of said exposure region; and
   measuring means for measuring the illuminance within said one or plurality of predetermined portions from an output of said photodetector means at said one or plurality of arbitrary positions.

6. A projection printer as claimed in claim 5 in which said photodetector means comprises a single photodetector, a covering member which covers the single photodetector and a pinhole formed in the covering member at a position corresponding to that of the single photodetector.

7. A projection printer as claimed in claim 6 in which said pinhole has a small size compared to that of a light receiving surface of the single photodetector, said pinhole having a diameter of 1 mm or less.

8. A projection printer as claimed in claim 6 in which said covering member has a top surface and/or a bottom surface with a low reflection coefficient.

9. A projection printer as claimed in claim 6 in which said covering member comprises a filter layer for passing only a predetermined light to reach the single photodetector.

10. A projection printer as claimed in claim 5 which further comprises control means for pre-storing position information related to the arbitrary positions within the exposure region on said first plane, said moving means sequentially moving said photodetector means to the arbitrary positions responsive to the position information from said control means.

11. A projection printer as claimed in claim 5 which further comprises a stage which is moved by said moving means, said first part being located in a central portion on said stage, said photodetector means being located on said stage at a position adjacent to said first part.

* * * * *

UNITED STATES PATENT AND TRADEMARK OFFICE
CERTIFICATE OF CORRECTION

PATENT NO. : 4,746,958   Page 1 of 3
DATED : May 24, 1988
INVENTOR(S) : Yamakawa It is certified that error appears in the above-identified patent and that said Letters Patent is hereby corrected as shown below:

In the Figures:

" 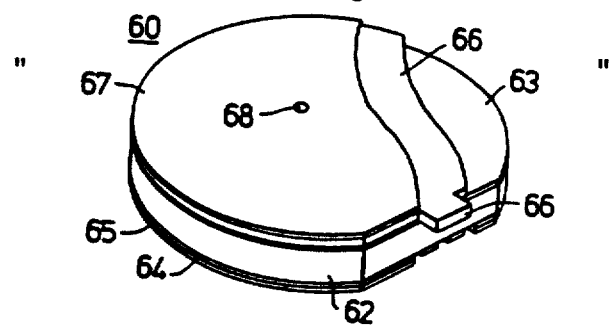 " should be

-- 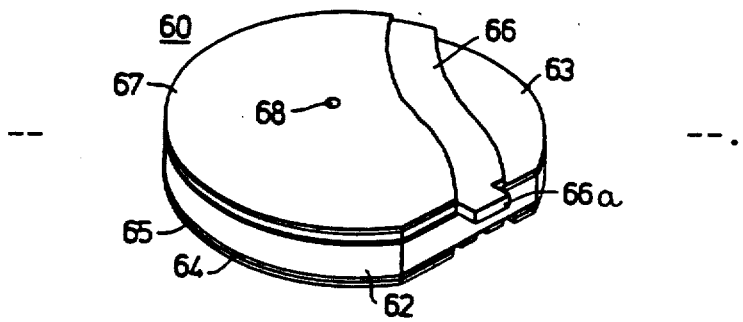 --.

UNITED STATES PATENT AND TRADEMARK OFFICE
CERTIFICATE OF CORRECTION

PATENT NO. : 4,746,958  Page 2 of 3
DATED : May 24, 1988
INVENTOR(S) : Yamakawa

It is certified that error appears in the above-identified patent and that said Letters Patent is hereby corrected as shown below:

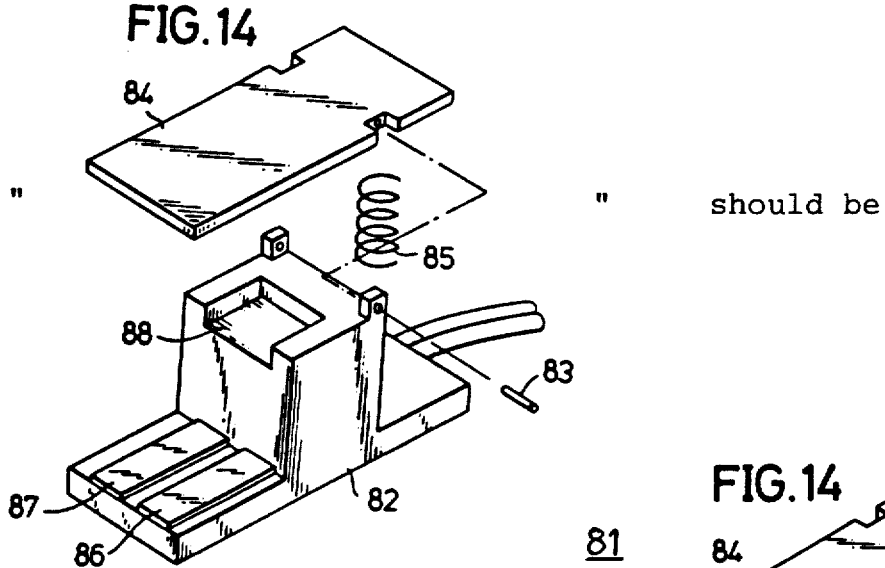

" 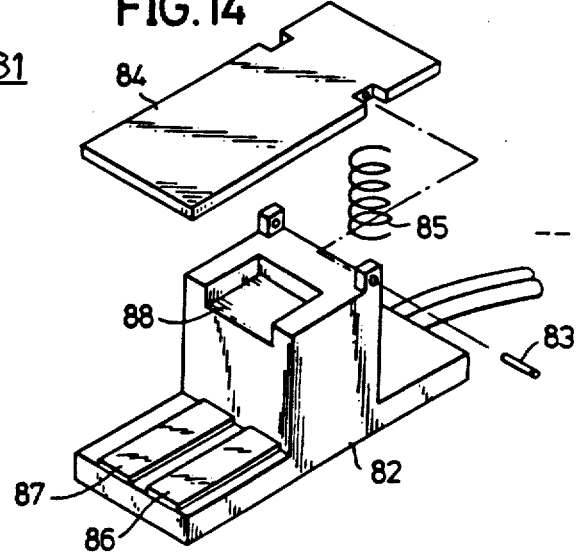 " should be

" -- -- . "

UNITED STATES PATENT AND TRADEMARK OFFICE
CERTIFICATE OF CORRECTION

PATENT NO. : 4,746,958

DATED : May 24, 1988

INVENTOR(S) : Yamakawa

It is certified that error appears in the above-identified patent and that said Letters Patent is hereby corrected as shown below:

Col. 1, line 58, "water" should be --wafer--.

Signed and Sealed this

Eleventh Day of October, 1988

Attest:

DONALD J. QUIGG

*Attesting Officer*  *Commissioner of Patents and Trademarks*